(12) United States Patent
Mckay et al.

(10) Patent No.: US 11,223,347 B1
(45) Date of Patent: Jan. 11, 2022

(54) ALL MICROWAVE ZZ CONTROL

(71) Applicant: International Business Machines Corporation, Armonk, NY (US)

(72) Inventors: David C. Mckay, Ossining, NY (US); Abhinav Kandala, Yorktown Heights, NY (US); Oliver Dial, Yorktown Heights, NY (US); Matthias Steffen, Mount Kisco, NY (US); Isaac Lauer, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/110,557

(22) Filed: Dec. 3, 2020

(51) Int. Cl.
*H03K 5/01* (2006.01)
*G06N 10/00* (2019.01)

(52) U.S. Cl.
CPC .............. *H03K 5/01* (2013.01); *G06N 10/00* (2019.01)

(58) Field of Classification Search
None
See application file for complete search history.

(56) References Cited

U.S. PATENT DOCUMENTS

| | | | |
|---|---|---|---|
| 6,930,318 B2 | 8/2005 | Vion et al. | |
| 7,018,852 B2 * | 3/2006 | Wu | B82Y 10/00 438/2 |
| 7,550,759 B2 | 6/2009 | Hakonen et al. | |
| 10,483,980 B2 | 11/2019 | Sete et al. | |
| 10,650,323 B2 | 5/2020 | Epstein et al. | |
| 2018/0225586 A1 | 8/2018 | Chow et al. | |
| 2021/0099201 A1 * | 4/2021 | Winick | G06N 10/00 |

FOREIGN PATENT DOCUMENTS

CN  109389223  2/2019

OTHER PUBLICATIONS

Koch et al., "Charge insensitive qubit design derived from the Cooper pair box," arXiv:cond-mat/0703002v2 [cond-mat.mes-hall], Sep. 26, 2007, 21 pages.
Magesan et al., "Effective Hamiltonian models of the cross-resonance gate," arXiv:1804.04073v2 [quant-ph], Feb. 25, 2019, 16 pages.
Malekakhlagh et al., "First-principles analysis of cross-resonance gate operation," arXiv:2005.00133v2 [quant-ph], May 5, 2020, 30 pages.
Noguchi et al., "Fast parametric two-qubit gates with suppressed residual interaction using a parity-violated superconducting qubit," arXiv:2005.02630 [quant-ph], May 7, 2020, 15 pages.
Li et al., "Entanglement of superconducting qubits via microwave fields: classical and quantum regimes," arXiv:0803.0397, Dec. 15, 2008, 18 pages.
Krinner et al., "Demonstration of an All-Microwave Controlled-Phase Gate between Far Detuned Qubits," arXiv:2006.10639 [quant-ph], Jun. 18, 2020, 10 pages.

* cited by examiner

*Primary Examiner* — Lincoln D Donovan
*Assistant Examiner* — Khareem E Almo
(74) *Attorney, Agent, or Firm* — Amin, Turocy & Watson, LLP

(57) ABSTRACT

Techniques facilitating dynamic control of ZZ interactions for quantum computing devices. In one example, a quantum coupling device can comprise a biasing component that is operatively coupled to first and second qubits via respective first and second drive lines. The biasing component can facilitate dynamic control of ZZ interactions between the first and second qubits using off-resonant microwave signals applied via the respective first and second drive lines.

24 Claims, 8 Drawing Sheets

ALL MICROWAVE ZZ CONTROL

BACKGROUND

The subject disclosure relates to quantum computing, and more specifically, to techniques of facilitating dynamic control of ZZ interactions for quantum computing devices.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate dynamic control of ZZ interactions for quantum computing devices are described.

According to an embodiment, a quantum coupling device can comprise a biasing component that is operatively coupled to first and second qubits via respective first and second drive lines. The biasing component can facilitate dynamic control of ZZ interactions between the first and second qubits using off-resonant microwave signals applied via the respective first and second drive lines.

According to another embodiment, a computer-implemented method can comprise operatively coupling, by a system operatively coupled to a processor, a biasing component to first and second qubits via respective first and second drive lines. The computer-implemented method can further comprise using, by the system, the biasing component to dynamically control ZZ interactions between the first and second qubits with off-resonant microwave signals applied via the respective first and second drive lines.

According to another embodiment, a computer program product can comprise a computer readable storage medium having program instructions embodied therewith. The program instructions are executable by a processor to cause the processor to perform operations. The operations can include operatively coupling, by the processor, a biasing component to first and second qubits via respective first and second drive lines. The operations can further include using, by the processor, the biasing component to facilitate dynamic control of ZZ interactions between the first and second qubits with off-resonant microwave signals applied via the respective first and second drive lines.

DETAILED DESCRIPTION

Figure 2:
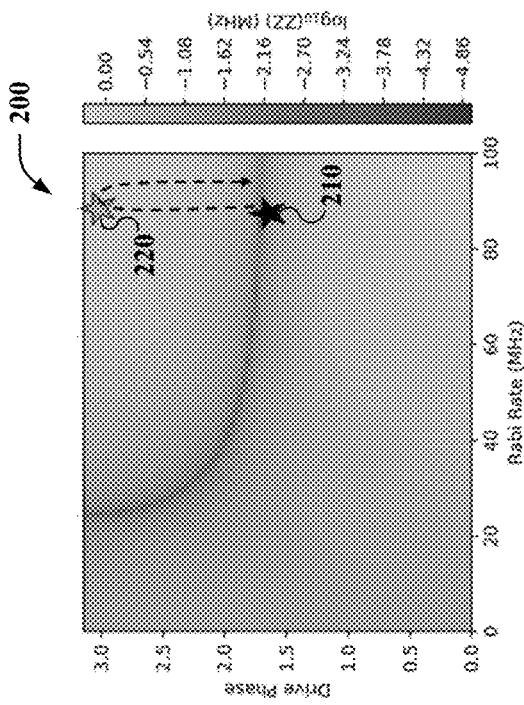
FIG. 2 illustrates an example, non-limiting logarithmically scaled graph depicting ZZ coupling versus a relative phase difference between off-resonant microwave signals and Rabi rate, in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Classical computers operate on binary digits (or bits) that store or represent information as binary states to perform computing and information processing functions. In contrast, quantum computing devices operate on quantum bits (or qubits) that store or represent information as both the binary states and superpositions of the binary states. To that end, quantum computing devices utilize quantum-mechanical phenomena, such as entanglement and interference.

A quantum computation uses a qubit as its essential unit instead of a classical computing bit. The qubit (e.g., quantum binary digit) is the quantum-mechanical analog of the classical bit. Whereas classical bits can only be in one of two basis states (e.g., 0 or 1), qubits can be in superpositions of those basis states (e.g., $\alpha|0\rangle+\beta|1\rangle$, where $\alpha$ and $\beta$ are complex scalars such that $|\alpha|^2+|\beta|^2=1$). Although a number of qubits can be simultaneously in an exponentially large number of states, when the state of the qubit is measured, the result is either 0 or 1. During operation of a quantum computer, the state of the qubits is transformed by operations known as gates. During those operations there can be constructive and/or deconstructive interference of the coefficients in front of the states (i.e., $\alpha$ and $\beta$). This dual property of superposition and interference allows quantum computers (e.g., computers that employ qubits instead of solely classical bits) to, in theory, solve certain problems more quickly than on a classical computer. General quantum programs require coordination of quantum and classical parts of a computation.

The following definitions are used throughout the present disclosure, unless specifically indicated otherwise. A "qubit" denotes a two-level quantum system. "CR" denotes a cross-resonance gate. "Anharmonicity" ($\alpha$) denotes a difference between the second and first excited state energy levels and the qubit transition (e.g., the lowest two energy levels). "On-resonance" refers to when a drive field is at the same frequency as a transition frequency in the quantum system. "Hamiltonian" denotes an energy of the quantum system expressed in terms of quantum operators. "Stark shift" denotes a shift in the energy levels of a quantum system due to an off-resonance drive field. "Stark drive" denotes an off-resonant drive that causes an ac Stark shift. "ZZ" denotes the shift in energy of the state when two qubits are excited. "Gate" denotes an operation on the quantum system that transforms the quantum state. "Single-qubit gate" denotes a gate that transforms the state of a single qubit (e.g., typically with a microwave drive). "Two-qubit gate" denotes a gate that transforms the joint state of two qubits, which involves some form of interaction between the two qubits.

One common type of quantum circuit implemented in quantum computing devices comprise fixed frequency transmon qubits with fixed coupling. Each qubit of such quantum circuits can have a microwave drive line that operatively couples that qubit to a biasing component. In an embodiment, a Hamiltonian of such quantum circuits can be approximated using the Hamiltonian defined by Equation 1:

$$H = \sum_{i=\{0,1\}} \left[ \omega_i \hat{n}_i + \frac{1}{2}\alpha_i \hat{n}_i(\hat{n}_i - 1) + \Omega_{d,i}\cos(\omega_{d,i}t + \phi_{d,i})(\hat{a}_i^\dagger + \hat{a}_i) \right] +$$

Equation 1

-continued
$$J(\hat{a}_0^\dagger + \hat{a}_0)(\hat{a}_1^\dagger + \hat{a}_1).$$

In accordance with Equation 1 above, $\omega_i$ denotes the qubit frequency for transmon i (e.g., the energy splitting between the lowest two levels), $\alpha_i$ denotes the anharmonicity for transmon i (e.g., the difference between the energy splitting between the first and second energy levels and $\omega_i$), $\hat{n}_i$ denotes the number operator for transmon i, $\Omega_{d,i}$ denotes the microwave drive strength on transmon i, $\phi_{d,i}$ denotes the drive phase on qubit i, $\hat{a}_i^\dagger$ denotes the creation operator for transmon i, $\hat{a}_i$ denotes the annihilation operator for qubit i, $\omega_{d,i}$ denotes the microwave drive frequency on transmon i, J is the exchange coupling between the qubits, and t denotes time. In an embodiment, Equation 1 can be a duffing oscillator approximation. The Hamiltonian defined by Equation 1 includes a qubit frequency term, an anharmonicity term, a drive term, and a coupling term that relates to a coupling between qubits. In Equation 1, the qubit frequency term corresponds to $\omega_i\hat{n}_i$, the anharmonicity term corresponds to $\frac{1}{2}\alpha_i\hat{n}_i(\hat{n}_i-1)$, the drive term corresponds to $\Omega_{d,i}\cos(\omega_{d,i}t+\phi_{d,i})$, and the coupling term corresponds to $J(\hat{a}_0^\dagger+\hat{a}_0)(\hat{a}_1^\dagger+\hat{a}_1)$.

In some instances, application of an "on-resonance" drive signal (e.g., $\omega_{d,i}=\omega_i$) can facilitate single-qubit gates. That is, applying an "on-resonance" drive signal can facilitate manipulating a state of a particular qubit. For example, the particular qubit can modulate between a $|0\rangle$ ground state and a $|1\rangle$ excited state. In some instances, cross-resonance can be performed by applying a drive signal that is resonant with a neighboring qubit. For example, cross-resonance can be performed if $\omega_{d,0}=\omega_1$ or vice-versa. Performing such cross-resonance can facilitate an all-microwave method for performing two-qubit gates.

In some instances, application of a "far off-resonance drive" (e.g., $|\omega_{d,i}-\omega_i|\gg\Omega_d$) can cause a "Stark shift". That is, applying a far off-resonance drive can cause a shift in the energy of a qubit. In an embodiment, a shift in the energy of a qubit caused by application of a far off-resonance drive can be approximated using the relationship defined by Equation 2:

$$\omega_{i,Stark} - \omega_i = \frac{\alpha_i}{2\Delta(\alpha_i + \Delta)}\Omega^2, \Delta = \omega_{d,i} - \omega_i.$$

Equation 2

In accordance with Equation 2 above, $\omega_{i,Stark}$ denotes the energy of the qubit after application of the off-resonance drive, $\Delta$ denotes the detuning of the off-resonance drive from the qubit frequency, and $\Omega$ denotes the strength of the off-resonance drive. One aspect of the form of the fixed coupling Hamiltonian defined by Equation 1 is that in the "dressed frame" (e.g., the frame after diagonalizing the Hamiltonian to account for the coupling term), there can be residual unwanted ZZ coupling. In an embodiment, the residual unwanted ZZ coupling can be approximated using the expression defined by Equation 3:

$$ZZ = 2J^2\left(\frac{1}{\omega_0 - \omega_1 + \alpha_0} + \frac{1}{\omega_1 - \omega_0 + \alpha_1}\right).$$

Equation 3

ZZ coupling between qubits can be adjusted by application of a single Stark drive, and in some instances a Stark drive can be used to cancel such ZZ interactions. Moreover, Stark induced ZZ coupling can be implemented by using a dual Stark drive to drive both qubits simultaneously at a same frequency. In an embodiment, ZZ coupling can be approximated in a high-power limit using the expression defined by Equation 4:

$$ZZ = 2J\,\cos(\phi_{d,1} - \phi_{d,0})\left(\frac{\Omega_{d,0}}{\Delta_0}\right)\left(\frac{\Omega_{d,1}}{\Delta_1}\right)\left(\frac{\alpha_1}{\Delta_1 - \alpha_1}\right)\left(\frac{\alpha_0}{\Delta_0 - \alpha_0}\right),\quad \text{Equation 4}$$

$$\Delta_i = \omega_d - \omega_i.$$

Equation 4 shows that a ZZ activation by Stark can be effectively set by the ratio of drive power to detuning. Equation 4 further shows that the Stark can be a function of the relative phase between the drive tones and can also be proportional to the coupling. Of note, this is not a resonant effect of higher transmon levels.

One element of a nontrivial quantum computing device is a coupling element known as a two-qubit gate that facilitates information exchanges between neighboring qubits. In some instances, a cross-resonance approach has been used to implement such two-qubit gates. However, quantum computing devices that implement cross-resonance gates can encounter various challenges with respect to both fabrication constraints and gate fidelity.

By way of example, viable cross-resonance gates generally involve neighboring qubits that are relatively close in frequency (e.g., within an anharmonicity), but not actually overlapping. If any resonance conditions are met (e.g., neighboring qubits have the same resonant frequency), then frequency collisions occur, and the quantum circuit is generally inoperable. This represents a particularly stringent requirement on the frequency of each qubit coupled to a given cross-resonance gate. As another example, the ZZ coupling discussed in Equation 3—an always-on ZZ interaction—can induce unwanted two-qubit coupling that can degrade circuit performance.

Figure 1:
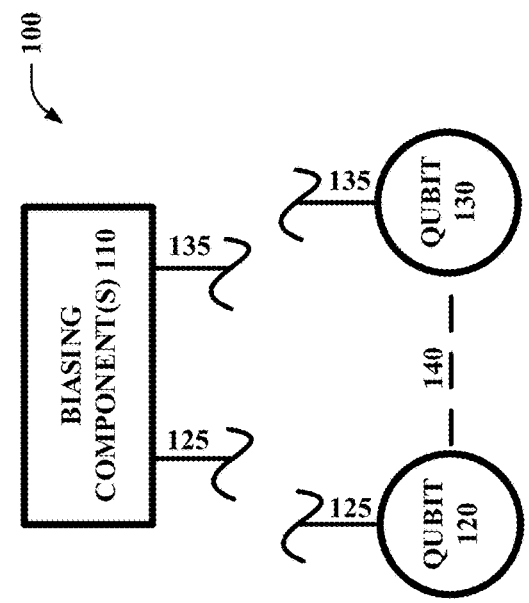
FIG. 1 illustrates a block diagram of an example, non-limiting device that can facilitate dynamic control of ZZ interactions for quantum computing devices, in accordance with one or more embodiments described herein.

FIG. 1 illustrates a block diagram of an example, non-limiting quantum coupling device 100 that can facilitate dynamic control of ZZ interactions for quantum computing devices, in accordance with one or more embodiments described herein. As illustrated by the example embodiment depicted in FIG. 1, device 100 includes a biasing component 110, a first qubit 120, and a second qubit 130. First qubit 120 and second qubit 130 are operatively coupled to biasing component 110 via first drive line 125 and second drive line 135, respectively. Examples of qubits that are suitable for implementing first qubit 120 and/or second qubit 130 include, but are not limited to: a fixed frequency qubit, a tunable qubit, a transmon qubit, a fixed frequency transmon qubit, a tunable transmon qubit, and the like. In an embodiment, first qubit 120 and/or second qubit 130 can be fixed-frequency, non-tunable qubits. As described in greater detail below, biasing component 110 can facilitate dynamic control of ZZ interactions between qubits (e.g., first qubit 120 and/or second qubit 130) using off-resonant microwave signals applied via respective drive lines (e.g., first drive line 125 and/or second drive line 135). By modifying aspects of such off-resonant microwave signals, embodiments of biasing component 110 can provide tunable coupling 140 between first qubit 120 and second qubit 130.

Figure 3:
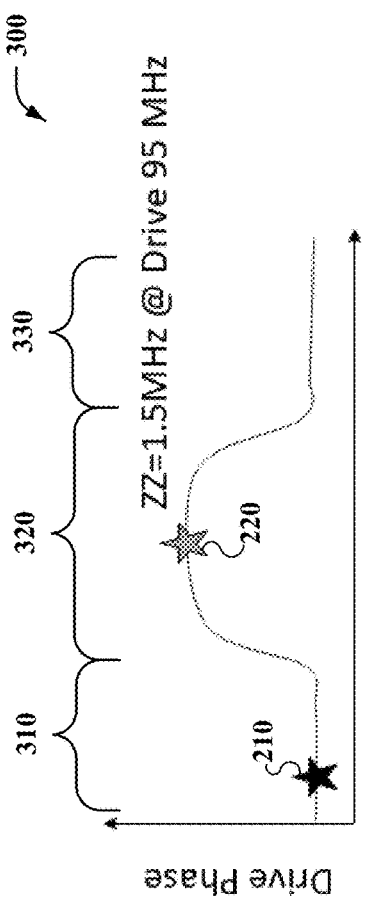
FIG. 3 illustrates an example, non-limiting graph depicting a relative phase difference between off-resonant microwave signals as a function of time, in accordance with one or more embodiments described herein.

FIGS. 2-3 illustrate an embodiment in which biasing component 110 can facilitate dynamic control of ZZ interactions between first qubit 120 and second qubit 130 by dynamically adjusting a relative phase difference between the off-resonant microwave signals. In the embodiment illustrated by FIGS. 2-3, biasing component 110 can apply the off-resonant microwave signals to first qubit 120 and second qubit 130 at a constant power value. In this embodiment, first qubit 120 and second qubit 130 can have resonant frequencies of 4900 Megahertz (MHz) and 5300 MHz, respectively. In this embodiment, first qubit 120 and second qubit 130 have an exchange coupling strength J of 3 MHz. The off-resonant microwave signals can include a first off-resonant microwave signal applied to first qubit 120 via first drive line 125 and a second off-resonant microwave signal applied to second qubit 130 via second drive line 135. In an embodiment, the first and second off-resonant microwave signals can have a frequency value defined by the respective resonant frequencies of first qubit 120 and second qubit 130. For example, in FIGS. 2-3, the frequency value of the first and second off-resonant microwave signals is 5100 MHz. In an embodiment, the first and second off-resonant microwave signals can have equal amplitude values. For example, in FIGS. 2-3 and the respective amplitude values of the first and second off-resonant microwave signals are equal. In an embodiment, a common source can generate the first and second off-resonant microwave signals. For example, biasing component 110 can comprise a microwave source that generates the first and second off-resonant microwave signals.

A Y-axis of graph 200 (e.g., the vertical axis of graph 200) represents a relative phase difference between the off-resonant microwave signals that biasing component 110 applies to first qubit 120 and second qubit 130. As illustrated by graph 200, ZZ coupling between first qubit 120 and second qubit 130 can vary based on the relative phase difference between the off-resonant microwave signals consistent with Equation 4. For example, graph 200 includes a low ZZ coupling point 210 at which ZZ coupling between first qubit 120 and second qubit 130 can be substantially zero. Graph 200 shows that the relative phase difference between the off-resonant microwave signals at the low ZZ coupling point 210 is approximately 1.7 radians. Graph 200 further includes a high ZZ coupling point 220 at which ZZ coupling between first qubit 120 and second qubit 130 is approximately 1.5 megahertz (MHz). Graph 200 shows that the relative phase difference between the off-resonant microwave signals at the high ZZ coupling point 220 is approximately 3.0 radians.

FIG. 3 illustrates an example, non-limiting graph 300 depicting a relative phase difference between off-resonant microwave signals as a function of time, in accordance with one or more embodiments described herein. As illustrated by graph 300, biasing component 110 can facilitate dynamic control of ZZ coupling 140 between first qubit 120 and second qubit 130 by dynamically adjusting (or controlling) the relative phase difference. For example, biasing component 110 can apply the off-resonant microwave signals to first qubit 120 and second qubit 130 at the constant power value with the relative phase difference of approximately 1.7 radians to cancel ZZ interactions between first qubit 120 and second qubit 130 during a first period 310. In this example, to induce ZZ interactions between first qubit 120 and second qubit 130, biasing component 110 can dynamically adjust the relative phase difference between the off-resonant microwave signals from approximately 1.7 radians to approximately 3.0 radians during a second period 320. ZZ coupling 140 between first qubit 120 and second qubit 130 can be undesirable during a third period 330. As such, biasing component 110 can dynamically adjust the relative phase difference between the off-resonant microwave signals from approximately 3.0 radians to approximately 1.7 radians, during the third period 330.

Figure 4:
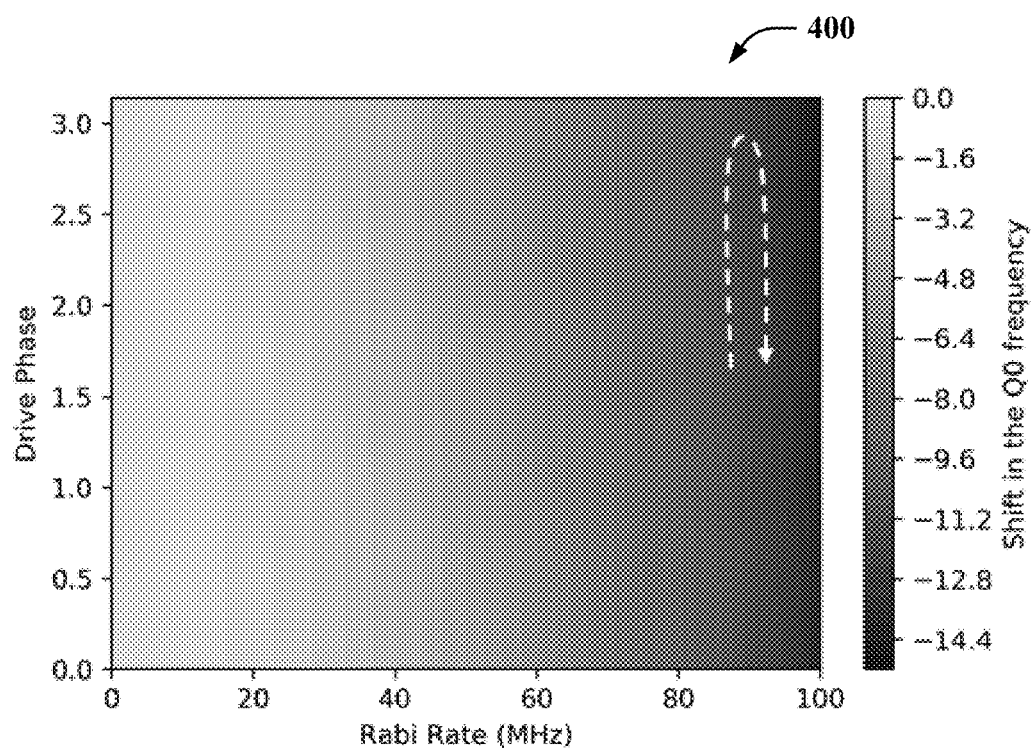
FIG. 4 illustrates an example, non-limiting graph depicting qubit frequency shift versus drive phase and Rabi rate, in accordance with one or more embodiments described herein.
Figure 5:
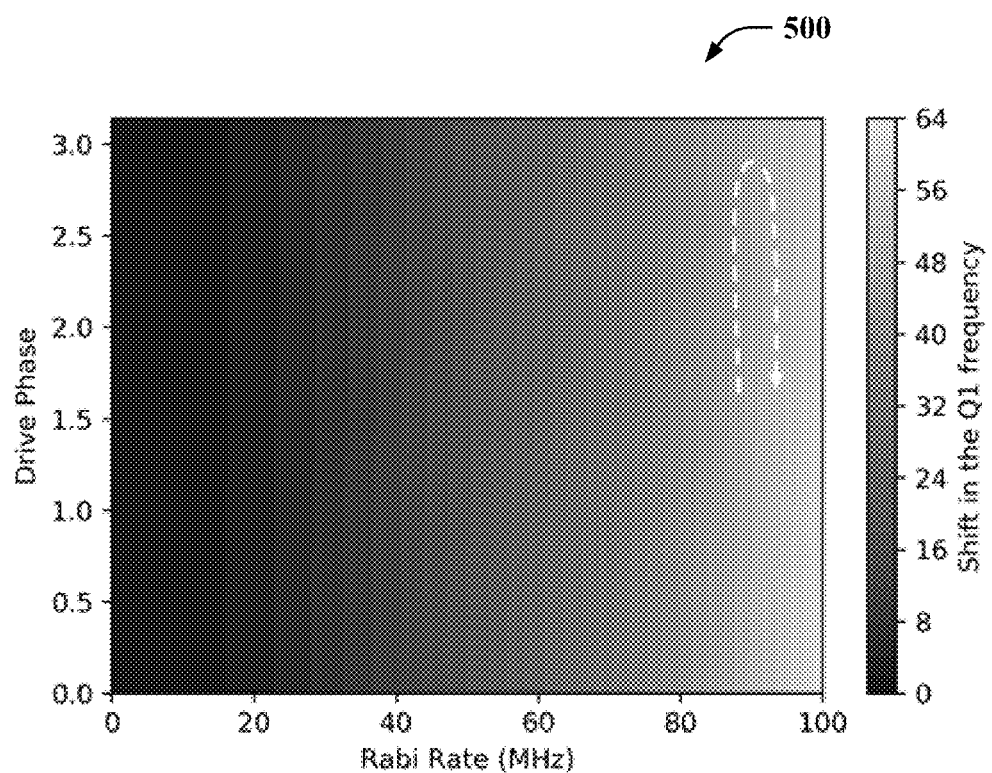
FIG. 5 illustrates another example, non-limiting graph depicting qubit frequency shift versus drive phase and Rabi rate, in accordance with one or more embodiments described herein.

FIGS. 4-5 illustrate example, non-limiting graphs depicting qubit frequency shift (e.g., Stark frequency shift) versus relative phase difference between off-resonant microwave signals and Rabi rate of both signals, in accordance with one or more embodiments described herein. In particular, example, non-limiting graph 400 depicts qubit frequency shifts of first qubit 120 and example, non-limiting graph 500 depicts qubit frequency shifts of second qubit 130. As illustrated by graphs 400 and 500, any shift in the respective qubit frequencies of first qubit 120 and second qubit 130 can be minimal as biasing component 110 dynamically adjusts the relative phase difference between the off-resonant microwave signals.

Figure 6:
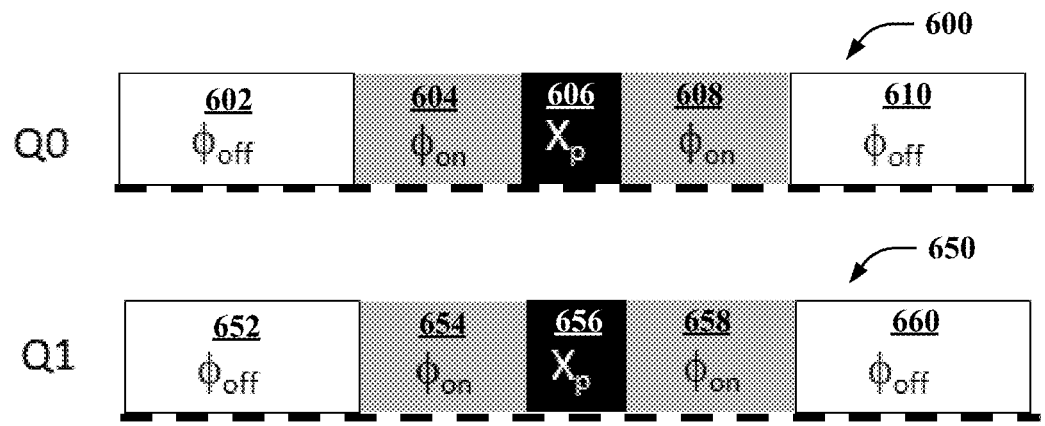
FIG. 6 illustrates example, non-limiting off-resonant microwave signals with echo π-pulses, in accordance with one or more embodiments described herein.
Figure 7:
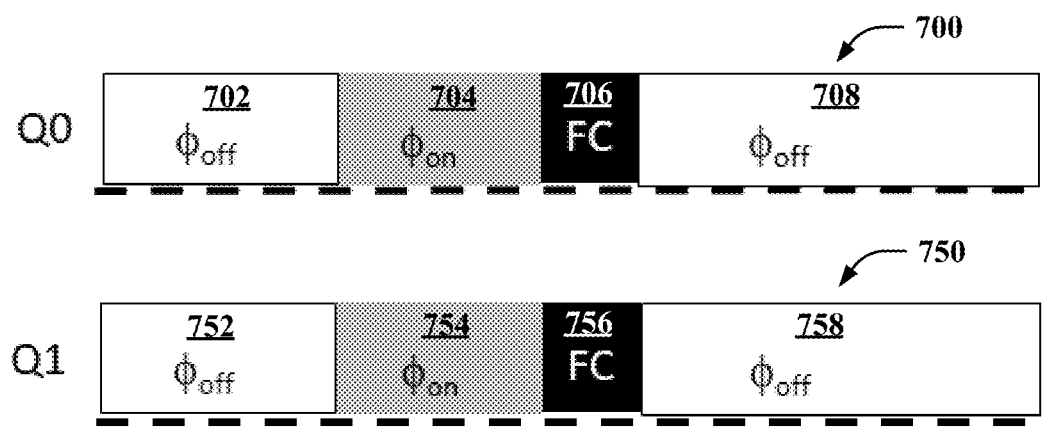
FIG. 7 illustrates example, non-limiting off-resonant microwave signals with frame change pulses, in accordance with one or more embodiments described herein.

In an embodiment, any single qubit Z errors resulting from that dynamic adjustment of the relative phase difference can be corrected by introducing echo π-pulses or frame change pulses into pulse sequences corresponding to the off-resonant microwave signals, as illustrated by FIGS. 6-7. FIGS. 6-7 illustrate example, non-limiting pulse sequences with echo π-pulses and frame change pulses, respectively. In particular, FIG. 6 illustrates a first pulse sequence 600 and a second pulse sequence 650. First pulse sequence 600 corresponds to a first off-resonant microwave signal that bias component 110 can apply to first qubit 120 via first drive line 125. Second pulse sequence 650 corresponds to a second off-resonant microwave signal that bias component 110 can apply to second qubit 130 via second drive line 135.

With reference to FIG. 3, pulses 602 and 652 correspond to the off-resonant microwave signals that biasing component 110 can apply during the first period 310 to cancel ZZ interactions between first qubit 120 and second qubit 130. Pulses 610 and 660 correspond to the off-resonant microwave signals that biasing component 110 can apply during the third period 330 to cancel ZZ interactions between first qubit 120 and second qubit 130. Pulses 604 and 608 collectively correspond to the first off-resonant microwave signal that biasing component 110 can apply to first qubit 120 during the second period 320 to induce ZZ interactions between first qubit 120 and second qubit 130. Likewise, pulses 654 and 658 collectively correspond to the second off-resonant microwave signal that biasing component 110 can apply to second qubit 130 during the second period 320.

To correct any single qubit Z errors (e.g., ZI interactions, IZ interactions, and/or qubit Stark shifts) resulting from the dynamic adjustment of the relative phase difference, biasing component 110 can introduce echo π-pulses into the off-resonant microwave pulses. For example, biasing component 110 can split pulses 604 and 608 into two separate pulses, as shown by FIG. 6. Biasing component 110 can also introduce echo π-pulse 606 into the first off-resonant microwave signal such that echo π-pulse 606 intervenes between pulse 604 and pulse 608. As another example, biasing component 110 can split pulses 654 and 658 into two separate pulses, as shown by FIG. 6. Biasing component 110 can also introduce echo π-pulse 656 into the second off-resonant microwave signal such that echo π-pulse 656 intervenes between pulse 654 and pulse 658.

FIG. 7 illustrates a first pulse sequence 700 and a second pulse sequence 750. First pulse sequence 700 corresponds to a first off-resonant microwave signal that bias component 110 can apply to first qubit 120 via first drive line 125. Second pulse sequence 750 corresponds to a second off-resonant microwave signal that bias component 110 can apply to second qubit 130 via second drive line 135.

With reference to FIG. 3, pulses 702 and 752 correspond to the off-resonant microwave signals that biasing component 110 can apply during the first period 310 to cancel ZZ interactions between first qubit 120 and second qubit 130. Pulses 708 and 758 correspond to the off-resonant microwave signals that biasing component 110 can apply during the third period 330 to cancel ZZ interactions between first qubit 120 and second qubit 130. Pulses 704 and 754 correspond to the first and second off-resonant microwave signals, respectively, that biasing component 110 can apply during the second period 320 to induce ZZ interactions between first qubit 120 and second qubit 130.

To correct any single qubit Z errors (e.g., ZI interactions, IZ interactions, and/or qubit Stark shifts) resulting from the dynamic adjustment of the relative phase difference, biasing component 110 can introduce frame change pulses into the off-resonant microwave pulses. For example, biasing component 110 can introduce frame change pulse 706 into the first off-resonant microwave signal such that frame change pulse 706 intervenes between pulse 704 and pulse 708. As another example, biasing component 110 can introduce frame change pulse 756 into the second off-resonant microwave signal such that frame change pulse 756 intervenes between pulse 754 and pulse 758.

Figure 8:
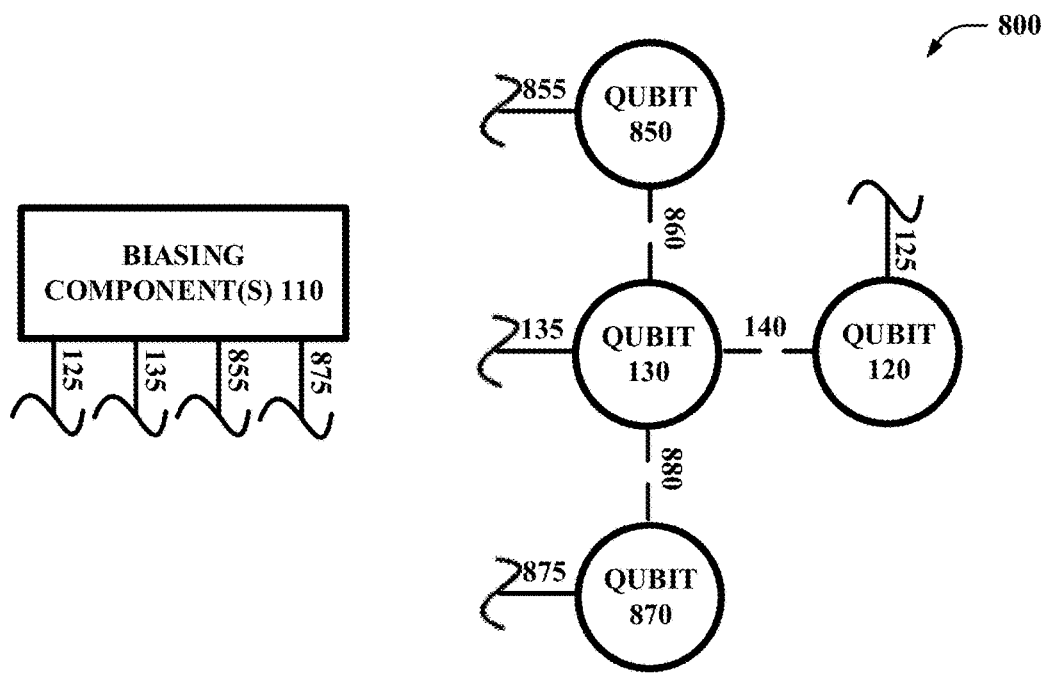
FIG. 8 illustrates a block diagram of an example, non-limiting quantum coupling device that can facilitate dynamic control of ZZ interactions for quantum computing devices, in accordance with one or more embodiments described herein.

FIG. 8 illustrates a block diagram of an example, non-limiting quantum coupling device 800 that can facilitate dynamic control of ZZ interactions for quantum computing devices, in accordance with one or more embodiments described herein. As illustrated by the example embodiment depicted in FIG. 8, device 800 includes a biasing component 110 operatively coupled to a lattice of qubits. In FIG. 8, the lattice of qubits include: first qubit 120, second qubit 130, third qubit 850, and fourth qubit 870. First qubit 120, second qubit 130, third qubit 850, and fourth qubit 870 are operatively coupled to biasing component 110 via first drive line 125, second drive line 135, third drive line 855, and fourth drive line 875, respectively. Examples of qubits that are suitable for implementing first qubit 120, second qubit 130, third qubit 850, and/or fourth qubit 870 include, but are not limited to: a fixed frequency qubit, a tunable qubit, a transmon qubit, a fixed frequency transmon qubit, a tunable transmon qubit, and the like. In an embodiment, first qubit 120, second qubit 130, third qubit 850, and/or fourth qubit 870 can be fixed-frequency, non-tunable qubits. As described in greater detail below, biasing component 110 can facilitate dynamic control of ZZ interactions between qubits within the lattice using off-resonant microwave signals applied via respective drive lines. In particular, biasing component 110 can facilitate dynamic control of pairwise ZZ interactions between select qubit pairs within the lattice using off-resonant microwave signals applied via respective drive lines.

In an embodiment in which first qubit 110 and second qubit 120 comprise a lattice of qubits that includes a third qubit (e.g., third qubit 850), using the biasing component 110 to facilitate dynamic control of ZZ interactions between the first and second qubits comprises sequentially applying pairwise ZZ interactions between select qubit pairs within the lattice to perform quantum algorithms. In an embodiment in which first qubit 110 and second qubit 120 comprise a lattice of qubits that includes a third qubit (e.g., third qubit 850), using the biasing component 110 to facilitate dynamic control of ZZ interactions between the first and second qubits comprises applying pairwise ZZ interactions between select qubit pairs within the lattice to perform adiabatic quantum computing.

Figure 9:
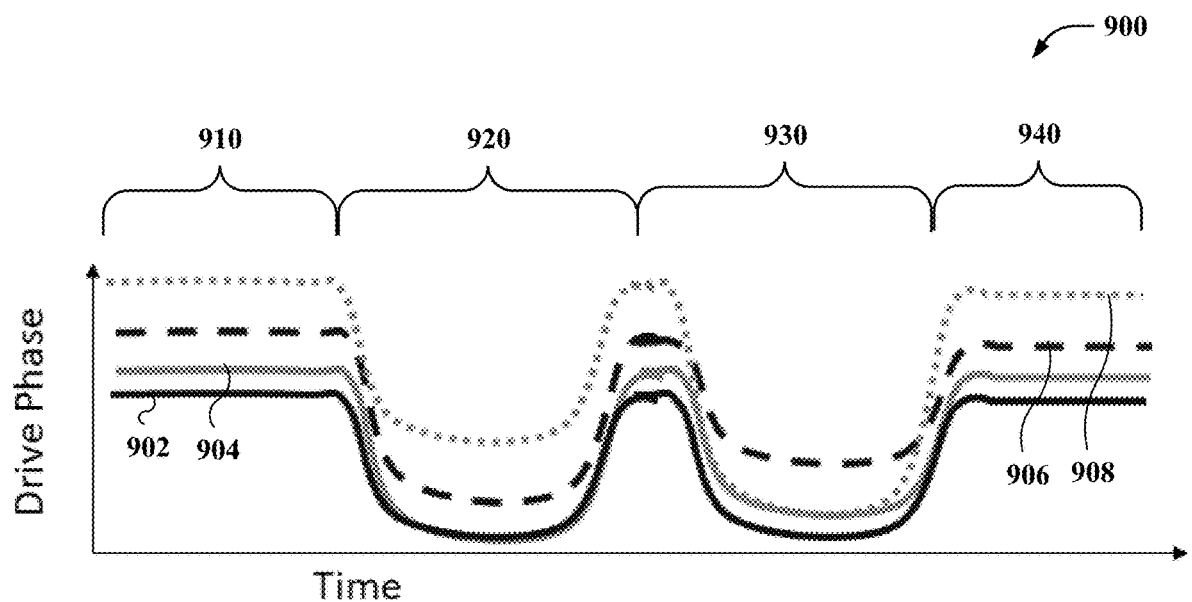
FIG. 9 illustrates an example, non-limiting graph depicting relative phase differences between off-resonant microwave signals as a function of time, in accordance with one or more embodiments described herein.

FIG. 9 illustrates an example, non-limiting graph 900 depicting relative phase differences between off-resonant microwave signals as a function of time, in accordance with one or more embodiments described herein. Graph 900 shows that biasing component 110 can facilitate dynamic control of pairwise ZZ interactions between select qubit pairs within the lattice of qubits depicted in FIG. 8 by dynamically adjusting (or controlling) relative phase differences of the off-resonant microwave signals. In the example illustrated by FIG. 9, biasing component 110 can cancel ZZ interactions between each pair of qubits within the lattice during a first period 910.

To that end, biasing component can apply off-resonant microwave signals via each respective drive line with respective phase differences that each correspond to a low ZZ coupling point (e.g., low ZZ coupling point 210 of FIG. 2). In an embodiment, the off-resonant microwave signals comprise a constant power value. As shown by graph 900, a phase difference exists between each off-resonant microwave signal applied during the first period 910. For example, a phase difference exists between a first off-resonant microwave signal 902 applied to first qubit 120 via first drive line 125 and a third off-resonant microwave signal 904 applied to third qubit 850 via third drive line 855. As another example, a phase difference exists between a second off-resonant microwave signal 906 applied to second qubit 130 via second drive line 135 and a fourth off-resonant microwave signal 908 applied to fourth qubit 870 via fourth drive line 875.

ZZ coupling 860 between first qubit 120 and third qubit 850 can be desirable during a second period 920. As such, biasing component 110 can dynamically adjust a relative phase difference between the first off-resonant microwave signal 902 and the third off-resonant microwave signal 904 during the second period 920 to induce ZZ interactions between first qubit 120 and third qubit 850. Biasing component 110 can suppress ZZ interactions between the other qubits within the lattice by maintaining the other respective phase differences such that only the relative phase difference between the first off-resonant microwave signal 902 and the third off-resonant microwave signal 904 changes during the second period 920. For example, biasing component 110 can suppress ZZ interactions between first qubit 120 and second qubit 130 during the second period 920 by maintaining a relative phase difference between the first off-resonant microwave signal 902 and the second off-resonant microwave signal 906.

ZZ coupling 880 between first qubit 120 and fourth qubit 870 can be desirable during a third period 930. As such, biasing component 110 can dynamically adjust a relative phase difference between the first off-resonant microwave signal 902 and the fourth off-resonant microwave signal 908 during the third period 930 to induce ZZ interactions between first qubit 120 and fourth qubit 870. Biasing component 110 can suppress ZZ interactions between the other qubits within the lattice by maintaining the other respective phase differences such that only the relative phase difference between the first off-resonant microwave signal 902 and the fourth off-resonant microwave signal 908 changes during the third period 930. For example, biasing component 110 can suppress ZZ interactions between first qubit 120 and third qubit 850 during the third period 930 by returning the relative phase difference between the first off-resonant microwave signal 902 and the third off-resonant microwave signal 904 that existed during the first period 910.

ZZ coupling between any qubits of the lattice can be undesirable during a fourth period 940. As such, biasing component 110 can dynamically adjust the relative phase differences of the off-resonant microwave signals during the fourth period such that the relative phase differences that existed between each off-resonant microwave signal during the first period 910 returns.

In an embodiment, a Hamiltonian of quantum coupling device 800 in the example discussed above with respect to FIG. 9 can be approximated using the Hamiltonian defined by Equation 5:

$$H = \sum_{i,j} \xi_{ij}(t) \hat{\sigma}_i^Z \hat{\sigma}_j^Z. \qquad \text{Equation 5}$$

In accordance with Equation 5 above, $\xi_{ij}$ denotes the time-dependent ZZ coupling strength between qubits i and j, $\hat{\sigma}_i^Z$ denotes the Pauli-Z operator for qubit i, and $\hat{\sigma}_j^Z$ denotes the Pauli-Z operator for qubit j. This Hamiltonian can be an expression of how the ZZ couplings are changing in time for the lattice of qubits as controlled by biasing components 110.

Figure 10:
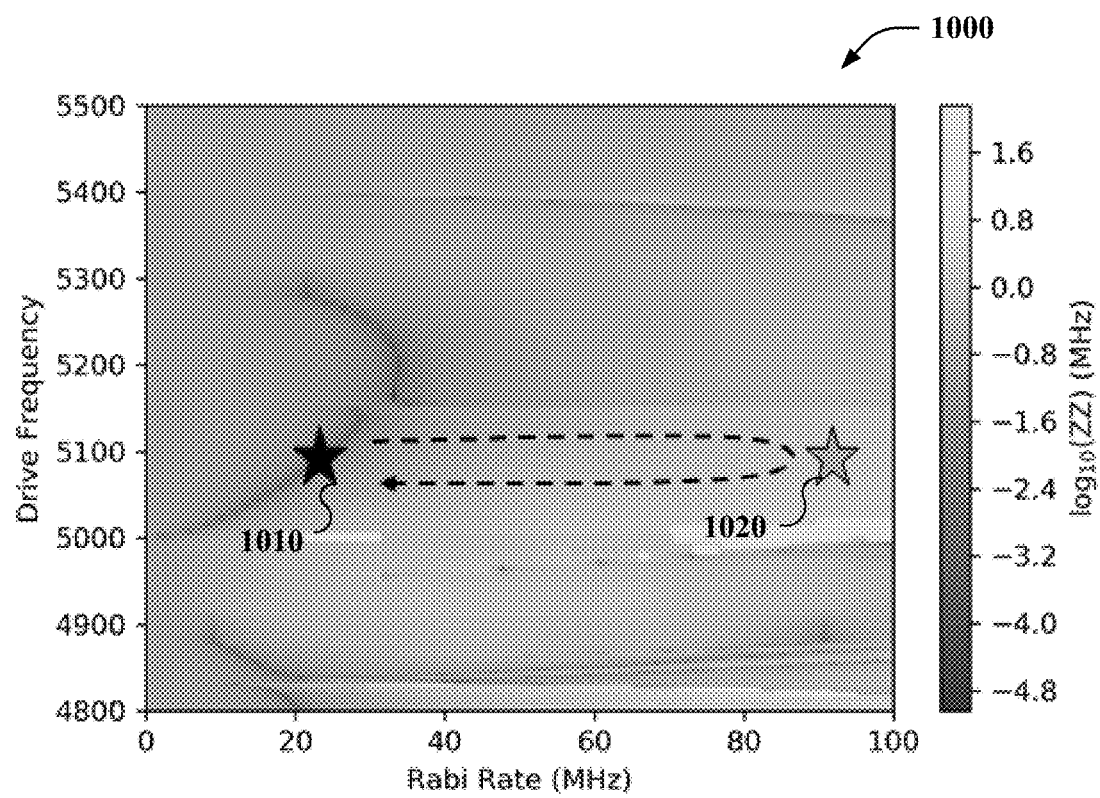
FIG. 10 illustrates an example, non-limiting logarithmically scaled graph depicting ZZ coupling versus off-resonant microwave signal frequency and off-resonant microwave signal amplitude, in accordance with one or more embodiments described herein.
Figure 11:
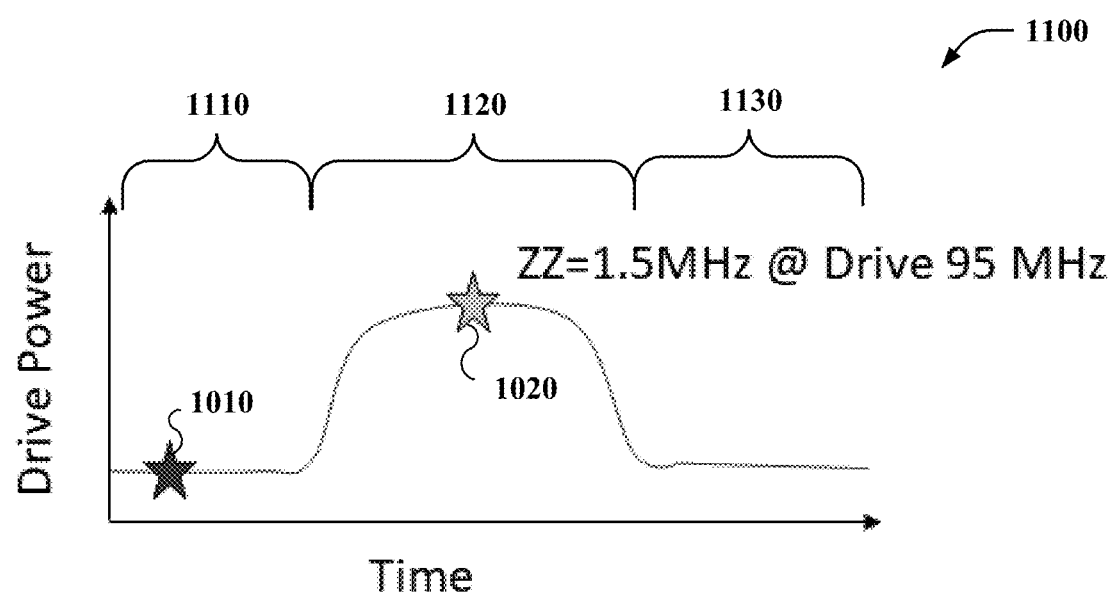
FIG. 11 illustrates an example, non-limiting graph depicting off-resonant microwave signal amplitude as a function of time, in accordance with one or more embodiments described herein.

FIGS. 10-11 illustrate an embodiment in which biasing component 110 of FIG. 1 can facilitate dynamic control of ZZ interactions between first qubit 120 and second qubit 130 by dynamically adjusting an amplitude (or drive power) of, at least, one of the off-resonant microwave signals. In this embodiment, first qubit 120 and second qubit 130 can have resonant frequencies of 4900 MHz and 5300 MHz, respectively. In this embodiment, first qubit 120 and second qubit 130 have an exchange coupling strength J of 3 MHz. The off-resonant microwave signals can include a first off-resonant microwave signal applied to first qubit 120 via first drive line 125 and a second off-resonant microwave signal applied to second qubit 130 via second drive line 135. In an embodiment, the first and second off-resonant microwave signals can have a frequency value defined by the respective resonant frequencies of first qubit 120 and second qubit 130. For example, in FIGS. 10-11, the frequency value of the first and second off-resonant microwave signals is 5100 MHz. In an embodiment, the first and second off-resonant microwave signals can have equal amplitude values. For example, in FIGS. 10-11, the respective amplitude values of the first and second off-resonant microwave signals are equal. In an embodiment, a phase difference between the first and second off-resonant microwave signals can be fixed. For example, in FIGS. 10-11, the phase difference between the first and second off-resonant microwave signals is fixed at π radians. In an embodiment, a common source can generate the first and second off-resonant microwave signals. For example, biasing component 110 can comprise a microwave source that generates the first and second off-resonant microwave signals.

An X-axis of graph 1000 (e.g., the horizontal axis of graph 1000) corresponds with an amplitude (or drive power) of the off-resonant microwave signals that biasing component 110 applies to first qubit 120 and second qubit 130. As illustrated by graph 1000, ZZ coupling between first qubit 120 and second qubit 130 can vary based on the amplitude of the off-resonant microwave signals. For example, graph 1000 includes a low ZZ coupling point 1010 at which ZZ coupling between first qubit 120 and second qubit 130 can be substantially zero. Graph 1000 shows that the amplitude of the off-resonant microwave signals at the low ZZ coupling point 1010 is approximately 25 MHz. Graph 1000 further includes a high ZZ coupling point 1020 at which ZZ coupling between first qubit 120 and second qubit 130 is approximately 1.5 MHz. Graph 200 shows that the amplitude of the off-resonant microwave signals at the high ZZ coupling point 1020 is approximately 95 MHz.

FIG. 11 illustrates an example, non-limiting graph 1100 depicting an amplitude of the off-resonant microwave signals as a function of time, in accordance with one or more embodiments described herein. As illustrated by graph 1100, biasing component 110 can facilitate dynamic control of ZZ coupling 140 between first qubit 120 and second qubit 130 by dynamically adjusting (or controlling) the amplitude of the off-resonant microwave signals. For example, biasing component 110 can apply the off-resonant microwave signals to first qubit 120 and second qubit 130 at an amplitude of approximately 25 MHz to cancel ZZ interactions between first qubit 120 and second qubit 130 during a first period 1110. In this example, to induce ZZ interactions between first qubit 120 and second qubit 130, biasing component 110 can dynamically adjust the amplitude of the off-resonant microwave signals from approximately 25 MHz to approximately 95 MHz during a second period 1120. ZZ coupling 140 between first qubit 120 and second qubit 130 can be undesirable during a third period 1130. As such, biasing component 110 can dynamically adjust the amplitude of the off-resonant microwave signals from approximately 95 MHz to approximately 25 MHz, during the third period 1130.

Figure 12:
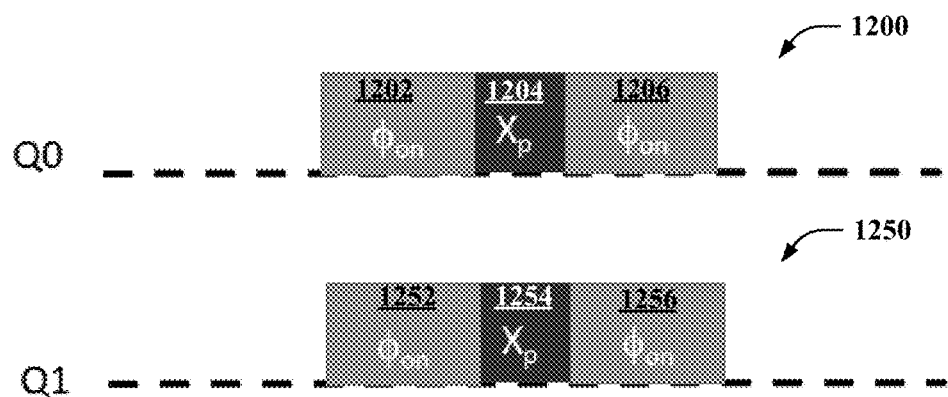
FIG. 12 illustrates example, non-limiting off-resonant microwave signals with echo π-pulses, in accordance with one or more embodiments described herein.
Figure 13:
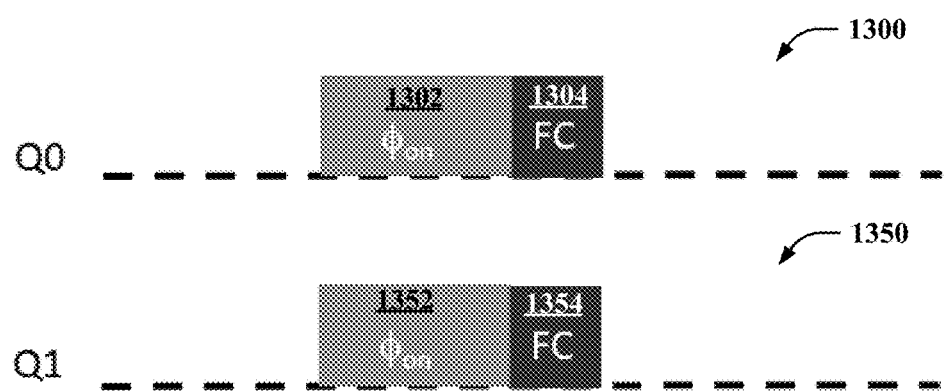
FIG. 13 illustrates example, non-limiting off-resonant microwave signals with frame change pulses, in accordance with one or more embodiments described herein.

In an embodiment, any single qubit Z errors resulting from that dynamic adjustment of the amplitude of the off-resonant microwave signals can be corrected by introducing echo π-pulses or frame change pulses into pulse sequences corresponding to the off-resonant microwave signals, as illustrated by FIGS. 12-13. FIGS. 12-13 illustrate example, non-limiting pulse sequences with echo π-pulses and frame change pulses, respectively. In particular, FIG. 12 illustrates a first pulse sequence 1200 and a second pulse sequence 1250. First pulse sequence 1200 corresponds to a first off-resonant microwave signal that bias component 110 can apply to first qubit 120 via first drive line 125. Second pulse sequence 1250 corresponds to a second off-resonant microwave signal that bias component 110 can apply to second qubit 130 via second drive line 135.

With reference to FIG. 11, pulses 1202 and 1206 collectively correspond to the first off-resonant microwave signal that biasing component 110 can apply to first qubit 120 during the second period 1120 to induce ZZ interactions between first qubit 120 and second qubit 130. Likewise, pulses 1252 and 1256 collectively correspond to the second off-resonant microwave signal that biasing component 110 can apply to second qubit 130 during the second period 1120.

To correct any single qubit Z errors (e.g., ZI interactions, IZ interactions, and/or qubit Stark shifts) resulting from the dynamic adjustment of the amplitude of the off-resonant microwave signals, biasing component 110 can introduce echo π-pulses into the off-resonant microwave pulses. For example, biasing component 110 can split pulses 1202 and 1206 into two separate pulses, as shown by FIG. 12. Biasing component 110 can also introduce echo π-pulse 1204 into the first off-resonant microwave signal such that echo π-pulse 1204 intervenes between pulse 1202 and pulse 1206. As another example, biasing component 110 can split pulses 1252 and 1256 into two separate pulses, as shown by FIG. 12. Biasing component 110 can also introduce echo π-pulse 1254 into the second off-resonant microwave signal such that echo π-pulse 1254 intervenes between pulse 1252 and pulse 1256.

FIG. 13 illustrates a first pulse sequence 1300 and a second pulse sequence 1350. First pulse sequence 1300 corresponds to a first off-resonant microwave signal that bias component 110 can apply to first qubit 120 via first drive line 125. Second pulse sequence 1350 corresponds to a second off-resonant microwave signal that bias component 110 can apply to second qubit 130 via second drive line 135. With reference to FIG. 11, pulses 1302 and 1352 correspond to the first and second off-resonant microwave signals, respectively, that biasing component 110 can apply during the second period 1120 to induce ZZ interactions between first qubit 120 and second qubit 130.

To correct any single qubit Z errors (e.g., ZI interactions, IZ interactions, and/or qubit Stark shifts) resulting the dynamic adjustment of the amplitude of the off-resonant microwave signals, biasing component 110 can introduce frame change pulses into the off-resonant microwave pulses. For example, biasing component 110 can introduce frame change pulse 1304 into the first off-resonant microwave signal such that frame change pulse 1304 follows pulse 1302 in first pulse sequence 1300. As another example, biasing component 110 can introduce frame change pulse 1354 into the second off-resonant microwave signal such that frame change pulse 1354 follows pulse 1352 in second pulse sequence 1350.

Figure 14:
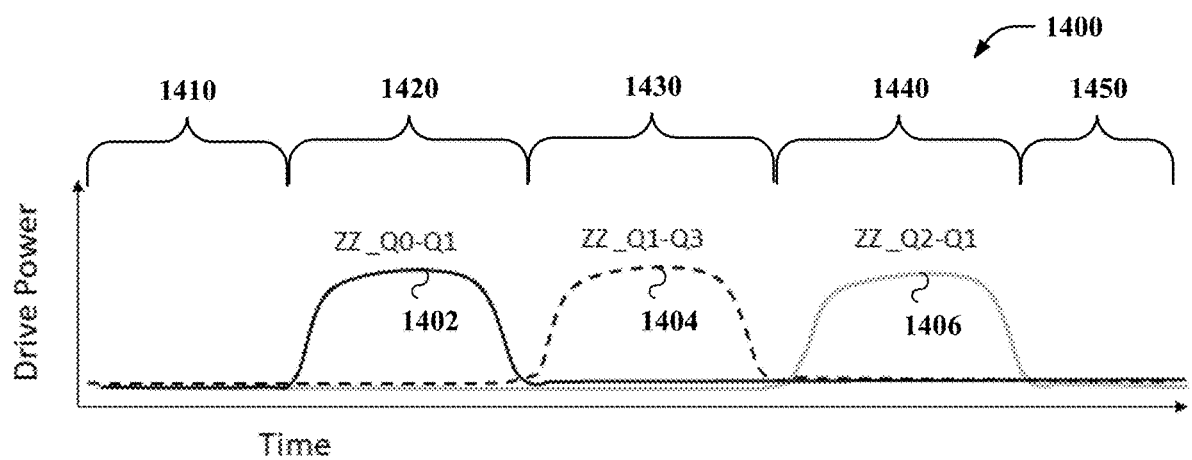
FIG. 14 illustrates an example, non-limiting graph depicting off-resonant microwave signal amplitudes as a function of time, in accordance with one or more embodiments described herein.

FIG. 14 illustrates an example, non-limiting graph 1400 depicting amplitudes (or drive power values) of off-resonant microwave signals as a function of time, in accordance with one or more embodiments described herein. Graph 1400 shows that biasing component 110 can facilitate dynamic control of pairwise ZZ coupling between select qubit pairs within the lattice of qubits depicted in FIG. 8 by dynamically adjusting (or controlling) an amplitude of, at least, one of the off-resonant microwave signals. In the example illustrated by FIG. 14, each pairwise ZZ coupling involves an off-resonant microwave signal with a different frequency. As such, the off-resonant microwave signals of FIG. 14 include: (i) a first off-resonant microwave signal 1402 with a first frequency that can be applied to first qubit 120 and second qubit 130 via respective drive lines; (ii) a second off-resonant microwave signal 1404 with a second frequency that can be applied to first qubit 120 and third qubit 850 via respective drive lines; and (iii) a third off-resonant microwave signal 1406 with a third frequency that can be applied to first qubit 120 and fourth qubit 870 via respective drive lines.

ZZ coupling between any qubits of the lattice can be undesirable during a first period 1410. As such, biasing component 110 cancel ZZ interactions between each pair of qubits within the lattice during a first period 1410 by applying each off-resonant microwave signal at a respective amplitude corresponding to a low ZZ coupling point (e.g., low ZZ coupling point 1010 of FIG. 10).

ZZ coupling 140 between first qubit 120 and second qubit 130 can be desirable during a second period 1420. As such, biasing component 110 can dynamically adjust (or pulse) an amplitude of the first off-resonant microwave signal 1402 from the amplitude that existed during the first period 1410 to an amplitude corresponding to a high ZZ coupling point (e.g., high ZZ coupling point 1020 of FIG. 10) during the second period 1420 to induce ZZ interactions between first qubit 120 and second qubit 130. Biasing component 110 can suppress ZZ interactions between the other qubits within the lattice by maintaining the other off-resonant microwave signals at the respective amplitudes that existed during the first period 1410. For example, biasing component 110 can suppress ZZ interactions between first qubit 120 and third qubit 850 during the second period 1420 by maintaining the second off-resonant microwave signal 1404 at the amplitude that existed during the first period 1410.

ZZ coupling 860 between first qubit 120 and third qubit 850 can be desirable during a third period 1430. As such, biasing component 110 can dynamically adjust (or pulse) an amplitude of the second off-resonant microwave signal 1404 from the amplitude that existed during the first period 1410 and second period 1420 to an amplitude corresponding to a high ZZ coupling point during the third period 1430 to induce ZZ interactions between first qubit 120 and third qubit 850. Biasing component 110 can suppress ZZ interactions between the other qubits within the lattice by applying the other off-resonant microwave signals at the respective amplitudes that existed during the first period 1410. For example, biasing component 110 can suppress ZZ interactions between first qubit 120 and second qubit 130 during the third period 1430 by dynamically adjusting the first off-resonant microwave signal 1402 from the amplitude that existed during the second period 1420 to the amplitude that existed during the first period 1410.

ZZ coupling 880 between first qubit 120 and fourth qubit 870 can be desirable during a fourth period 1440. As such, biasing component 110 can dynamically adjust (or pulse) an amplitude of the third off-resonant microwave signal 1406 from the amplitude that existed from the first period 1410 through the third period 1430 to an amplitude corresponding to a high ZZ coupling point during the fourth period 1440 to induce ZZ interactions between first qubit 120 and fourth qubit 870. Biasing component 110 can suppress ZZ interactions between the other qubits within the lattice by applying the other off-resonant microwave signals at the respective amplitudes that existed during the first period 1410. For example, biasing component 110 can suppress ZZ interactions between first qubit 120 and third qubit 850 during the fourth period 1440 by dynamically adjusting the second off-resonant microwave signal 1404 from the amplitude that existed during the third period 1430 to the amplitude that existed during the first period 1410 and the second period 1420.

ZZ coupling between any qubits of the lattice can be undesirable during a fifth period 1450. As such, biasing component 110 can cancel ZZ interactions between each pair of qubits within the lattice during the fifth period 1450 by applying each off-resonant microwave signal at the respective amplitude corresponding to the low ZZ coupling point.

Figure 15:
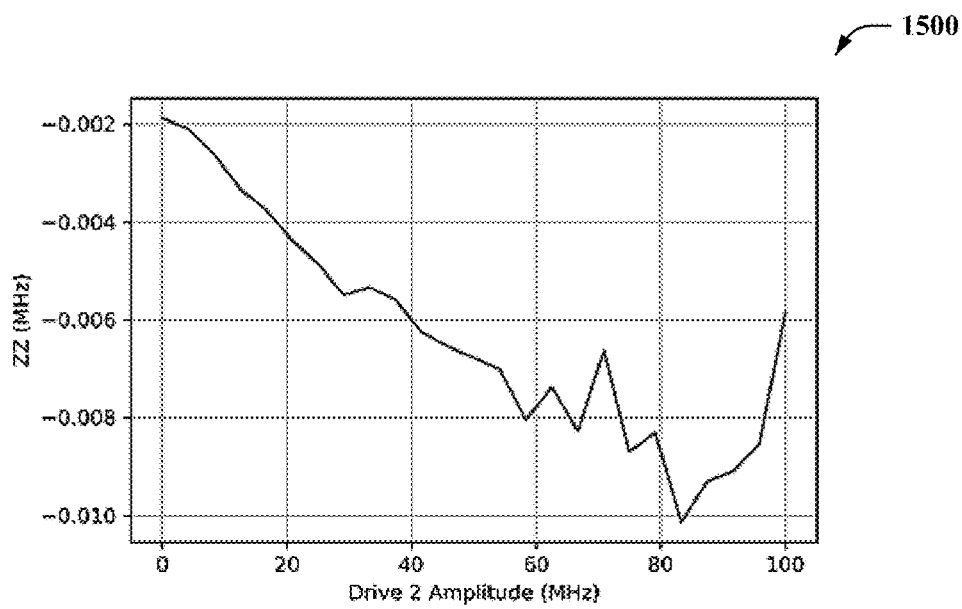
FIG. 15 illustrates an example, non-limiting graph depicting ZZ coupling as a function of an additional off-resonant microwave signal amplitude, in accordance with one or more embodiments described herein.

FIG. 15 illustrates an example, non-limiting graph 1500 depicting ZZ coupling as a function of an additional off-resonant microwave signal amplitude, in accordance with one or more embodiments described herein. In the example of FIG. 15, first qubit 120 and second qubit 130 can have resonant frequencies of 4900 MHz and 5300 MHz, respectively. In the example of FIG. 15, first qubit 120 and second qubit 130 have an exchange coupling strength J of 3 MHz. To obtain example graph 1500, biasing component 110 applies a common off-resonant microwave signal with a frequency of 5100 MHz to first qubit 120 and second qubit 130. Biasing component 110 also applies an additional off-resonant microwave signal with a frequency of 5250 MHz to first qubit 120. An X-axis of graph 1500 (e.g., the horizontal axis of graph 1500) corresponds with the amplitude (or drive power) of the additional off-resonant microwave signal.

Figure 16:
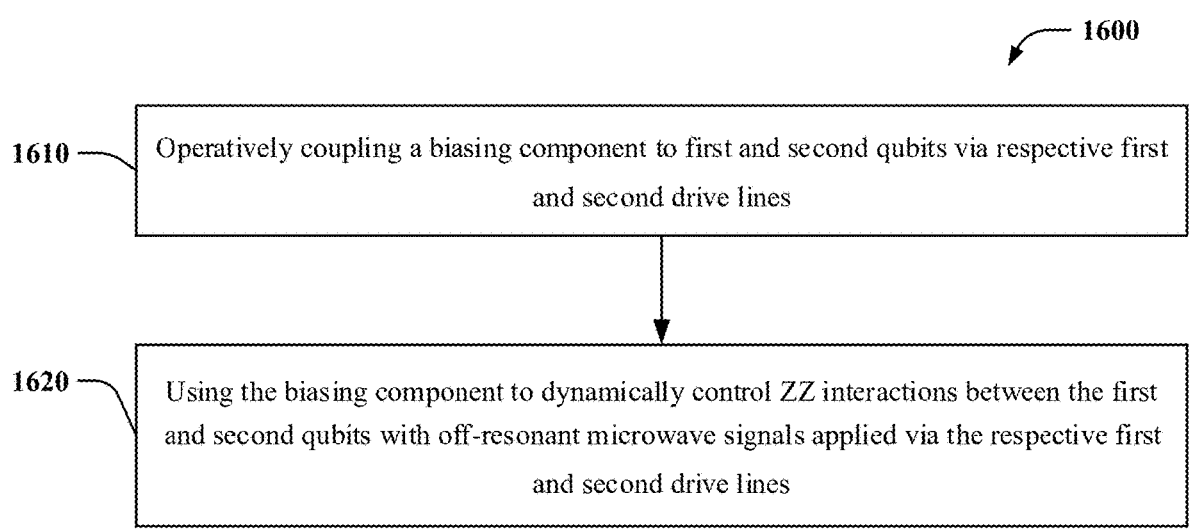
FIG. 16 illustrates a flow diagram of an example, non-limiting computer-implemented method of facilitating dynamic control of ZZ interactions for quantum computing devices, in accordance with one or more embodiments described herein.

FIG. 16 illustrates a flow diagram of an example, non-limiting computer-implemented method 1600 of facilitating dynamic control of ZZ interactions for quantum computing devices, in accordance with one or more embodiments described herein. Repetitive description of like elements employed in other embodiments described herein is omitted for sake of brevity.

At 1610, the computer-implemented method 1600 can comprise operatively coupling, by a system operatively coupled to a processor, a biasing component (e.g., biasing component 110 of FIG. 1) to first and second qubits (e.g., first qubit 120 and second qubit 130) via respective first and second drive lines (e.g., first drive line 125 and second drive line 135).

At 1620, the computer-implemented method 1600 can comprise using, by the system, the biasing component to dynamically control ZZ interactions between the first and second qubits with off-resonant microwave signals applied via the respective first and second drive lines. In an embodiment, using the biasing component to dynamically control ZZ interactions between the first and second qubits can comprise dynamically adjusting, by the system, a relative phase difference between the off-resonant microwave signals. In an embodiment, a common source can generate the off-resonant microwave signals. In an embodiment, the off-resonant microwave signals can comprise a frequency value defined by respective resonant frequencies of the first and second qubits. In an embodiment, the off-resonant microwave signals can comprise a constant power value.

In an embodiment, using the biasing component to dynamically control ZZ interactions between the first and second qubits can comprise dynamically adjusting an amplitude of at least one of the off-resonant microwave signals. In an embodiment, the first and second qubits comprise a lattice of qubits that includes a third qubit (e.g., third qubit 850 of FIG. 8). In an embodiment, using the biasing component to facilitate dynamic control of ZZ interactions between the first and second qubits can comprise sequentially applying pairwise ZZ interactions between select qubit pairs within the lattice to perform quantum algorithms. In an embodiment, using the biasing component to facilitate dynamic control of ZZ interactions between the first and second qubits can comprise applying pairwise ZZ interactions between select qubit pairs within the lattice to perform adiabatic quantum computing.

In an embodiment, the computer-implemented method 1600 can further comprise operatively coupling, by the system, a third qubit (e.g., third qubit 850 of FIG. 8) to the biasing component via a third drive line (e.g., third drive line 855). In an embodiment, the computer-implemented method 1600 can further comprise inducing, by the system, a ZZ interaction between the first and third qubits with the biasing component by adjusting a relative phase difference between the off-resonant microwave signals applied via the respective first and third drive lines.

In an embodiment, the computer-implemented method 1600 can further comprise operatively coupling a third qubit (e.g., third qubit 850 of FIG. 8) to the biasing component via a third drive line (e.g., third drive line 855). In an embodiment, the computer-implemented method 1600 can further comprise suppressing ZZ interactions between the third and first qubits with the biasing component by maintaining phase differences between the off-resonant microwave signals applied via the respective third and first drive lines.

Figure 17:
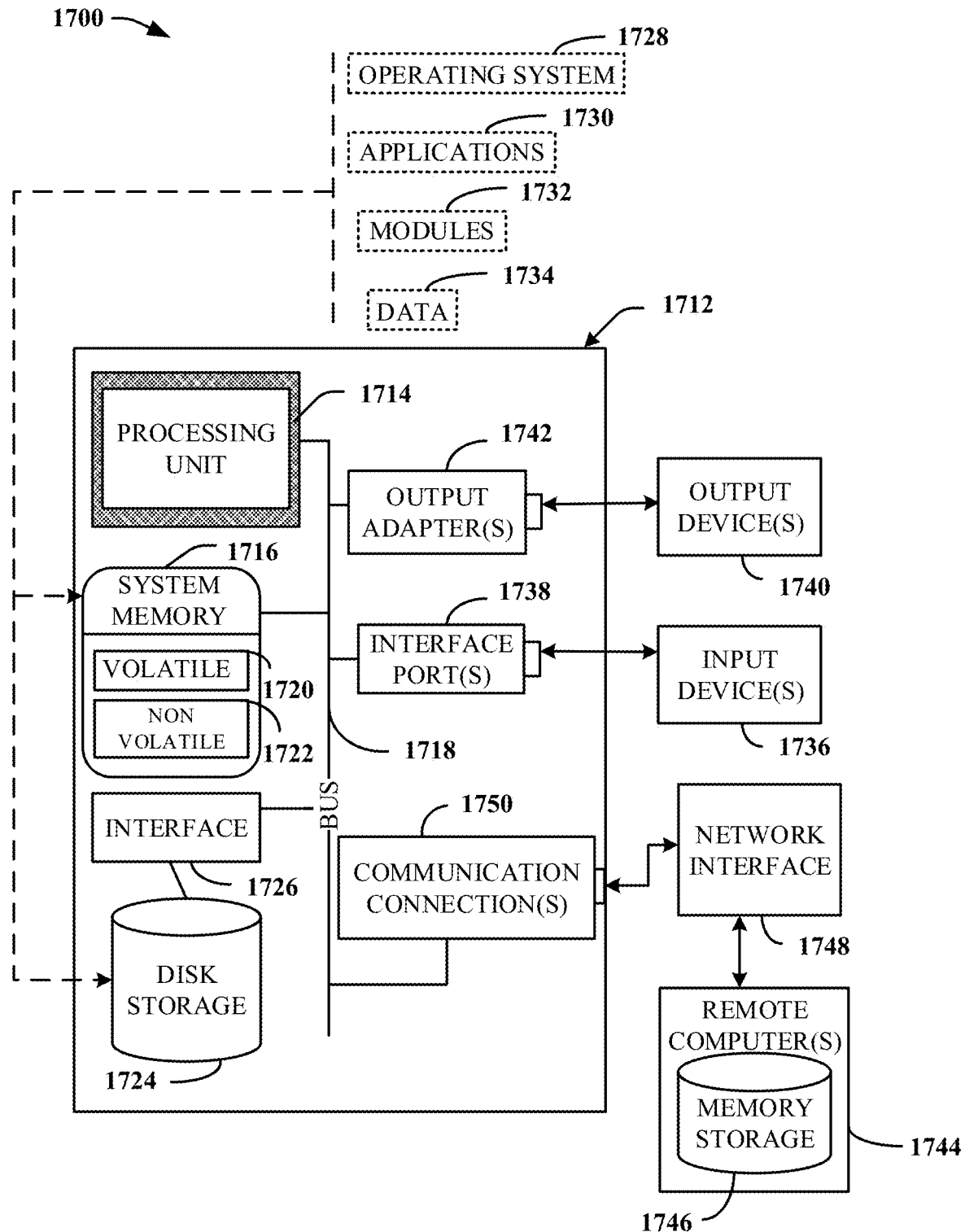
FIG. 17 illustrates a block diagram of an example, non-limiting operating environment in which one or more embodiments described herein can be facilitated.

In order to provide a context for the various aspects of the disclosed subject matter, FIG. 17 as well as the following discussion are intended to provide a general description of a suitable environment in which the various aspects of the disclosed subject matter can be implemented. FIG. 17 illustrates a suitable operating environment 1700 for implementing various aspects of this disclosure can also include a computer 1712. The computer 1712 can also include a processing unit 1714, a system memory 1716, and a system bus 1718. The system bus 1718 couples system components including, but not limited to, the system memory 1716 to the processing unit 1714. The processing unit 1714 can be any of various available processors. Dual microprocessors and other multiprocessor architectures also can be employed as the processing unit 1714. The system bus 1718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1094), and Small Computer Systems Interface (SCSI). The system memory 1716 can also include volatile memory 1720 and nonvolatile memory 1722. The basic input/output system (BIOS), containing the basic routines to transfer information between elements within the computer 1712, such as during start-up, is stored in nonvolatile memory 1722. By way of illustration, and not limitation, nonvolatile memory 1722 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 1720 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1712 can also include removable/non-removable, volatile/nonvolatile computer storage media. FIG. 17 illustrates, for example, a disk storage 1724. Disk storage 1724 can also include, but is not limited to, devices like a magnetic disk drive, floppy disk drive, tape drive, Jaz drive, Zip drive, LS-100 drive, flash memory card, or memory stick. The disk storage 1724 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1724 to the system bus 1718, a removable or non-removable interface is typically used, such as interface 1726. FIG. 17 also depicts software that acts as an intermediary between users and the basic computer resources described in the suitable operating environment 1700. Such software can also include, for example, an operating system 1728. Operating system 1728, which can be stored on disk storage 1724, acts to control and allocate resources of the computer 1712. System applications 1730 take advantage of the management of resources by operating system 1728 through program modules 1732 and program data 1734, e.g., stored either in system memory 1716 or on disk storage 1724. It is to be appreciated that this disclosure can be implemented with various operating systems or combinations of operating systems. A user enters commands or information into the computer 1712 through input device(s) 1736. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1714 through the system bus 1718 via interface port(s) 1738. Interface port(s) 1738 include, for example, a serial port, a parallel port, a game port, and a universal serial bus (USB). Output device(s) 1740 use some of the same type of ports as input device(s) 1736. Thus, for example, a USB port can be used to provide input to computer 1712, and to output information from computer 1712 to an output device 1740. Output adapter 1742 is provided to illustrate that there are some output devices 1740 like monitors, speakers, and printers, among other output devices 1740, which require special adapters. The output adapters 1742 include, by way of illustration and not limitation, video and sound cards that provide a means of connection between the output device 1740 and the system bus 1718. It can be noted that other devices and/or systems of devices provide both input and output capabilities such as remote computer(s) 1744.

Computer 1712 can operate in a networked environment using logical connections to one or more remote computers, such as remote computer(s) 1744. The remote computer(s) 1744 can be a computer, a server, a router, a network PC, a workstation, a microprocessor-based appliance, a peer device or other common network node and the like, and typically can also include many or the elements described relative to computer 1712. For purposes of brevity, only a memory storage device 1746 is illustrated with remote computer(s) 1744. Remote computer(s) 1744 is logically connected to computer 1712 through a network interface 1748 and then physically connected via communication connection 1750. Network interface 1748 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1750 refers to the hardware/software employed to connect the network interface 1748 to the system bus 1718. While communication connection 1750 is shown for illustrative clarity inside computer 1712, it can also be external to computer 1712. The hardware/software for connection to the network interface 1748 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum coupling device, comprising:
a biasing component that is operatively coupled to first and second qubits via respective first and second drive lines, wherein the biasing component facilitates dynamic control of ZZ interactions between the first and second qubits using off-resonant microwave signals applied via the respective first and second drive lines.

2. The quantum coupling device of claim 1, wherein the biasing component facilitates dynamic control of ZZ interactions between the first and second qubits by dynamically adjusting a relative phase difference between the off-resonant microwave signals.

3. The quantum coupling device of claim 1, wherein a common source generates the off-resonant microwave signals.

4. The quantum coupling device of claim 1, wherein the off-resonant microwave signals comprise a frequency value defined by respective resonant frequencies of the first and second qubits.

5. The quantum coupling device of claim 1, wherein the off-resonant microwave signals comprise a constant power value.

6. The quantum coupling device of claim 1, wherein single qubit Z errors are corrected by echoes or frame changes.

7. The quantum coupling device of claim 1, further comprising a third qubit operatively coupled to the biasing component via a third drive line, wherein the biasing component induces a ZZ interaction between the first and third qubits by adjusting a relative phase difference between the off-resonant microwave signals applied via the respective first and third drive lines.

8. The quantum coupling device of claim 1, further comprising a third qubit operatively coupled to the biasing component via a third drive line, wherein the biasing component suppresses ZZ interactions between the third qubit and the first qubit by maintaining phase differences between the off-resonant microwave signals applied via the respective third and first drive lines.

9. The quantum coupling device of claim 1, wherein the biasing component controls ZZ interactions between the first and second qubits by dynamically adjusting an amplitude of at least one of the off-resonant microwave signals.

10. The quantum coupling device of claim 1, wherein qubit stark shifts are cancelled by echoes or frame changes for ZZ gate operation.

11. A computer-implemented method comprising:
operatively coupling, by a system operatively coupled to a processor, a biasing component to first and second qubits via respective first and second drive lines; and
using, by the system, the biasing component to dynamically control ZZ interactions between the first and second qubits with off-resonant microwave signals applied via the respective first and second drive lines.

12. The computer-implemented method of claim 11, wherein using the biasing component to dynamically control ZZ interactions between the first and second qubits comprises:
dynamically adjusting, by the system, a relative phase difference between the off-resonant microwave signals.

13. The computer-implemented method of claim 11, wherein a common source generates the off-resonant microwave signals.

14. The computer-implemented method of claim 11, wherein the off-resonant microwave signals comprise a frequency value defined by respective resonant frequencies of the first and second qubits.

15. The computer-implemented method of claim 11, wherein the off-resonant microwave signals comprise a constant power value.

16. The computer-implemented method of claim 11, further comprising:
operatively coupling, by the system, a third qubit to the biasing component via a third drive line; and
inducing, by the system, a ZZ interaction between the first and third qubits with the biasing component by adjusting a relative phase difference between the off-resonant microwave signals applied via the respective first and third drive lines.

17. The computer-implemented method of claim 11, further comprising:
operatively coupling, by the system, a third qubit to the biasing component via a third drive line; and
suppressing, by the system, ZZ interactions between the third and first qubits with the biasing component by maintaining phase differences between the off-resonant microwave signals applied via the respective third and first drive lines.

18. The computer-implemented method of claim 11, wherein using the biasing component to facilitate dynamic control of ZZ interactions between the first and second qubits comprises:
dynamically adjusting, by the system, an amplitude of at least one of the off-resonant microwave signals.

19. The computer-implemented method of claim 11, wherein the first and second qubits comprise a lattice of qubits that includes a third qubit, and wherein using the biasing component to facilitate dynamic control of ZZ interactions between the first and second qubits comprises:
sequentially applying pairwise ZZ interactions between select qubit pairs within the lattice to perform quantum algorithms.

20. The computer-implemented method of claim 11, wherein the first and second qubits comprise a lattice of qubits that includes a third qubit, and wherein using the biasing component to facilitate dynamic control of ZZ interactions between the first and second qubits comprises:
applying pairwise ZZ interactions between select qubit pairs within the lattice to perform adiabatic quantum computing.

21. The computer-implemented method of claim 11, further comprising:
operatively coupling, by the system, a third qubit to the biasing component via a third drive line;
dynamically adjusting a first off-resonant microwave signal applied via the first and third drive lines to a first amplitude corresponding to a high ZZ coupling point; and
applying a second off-resonant microwave signal applied via the first and second drive lines at a second amplitude corresponding to a low ZZ coupling point, wherein the off-resonant microwave signals comprise the first and second off-resonant microwave signals, and wherein the first off-resonant microwave signal comprises a first frequency and the second off-resonant microwave signal comprises a second frequency that is distinct from the first frequency.

22. A computer program product comprising a computer readable storage medium having program instructions embodied therewith, the program instructions executable by a processor to cause the processor to:

operatively couple a biasing component to first and second qubits via respective first and second drive lines; and use the biasing component to facilitate dynamic control of ZZ interactions between the first and second qubits with off-resonant microwave signals applied via the respective first and second drive lines.

23. The computer program product of claim 22, wherein the program instructions are further executable by the processor to cause the processor to:

use the biasing component to facilitate dynamic control of ZZ interactions between the first and second qubits by dynamically adjusting a relative phase difference between the off-resonant microwave signals or by adjusting an amplitude of at least one of the off-resonant microwave signals.

24. The computer program product of claim 22, wherein the program instructions are further executable by the processor to cause the processor to:

use the biasing component to facilitate dynamic control of ZZ interactions between the first and second qubits by dynamically adjusting an amplitude of, at least, one of the off-resonant microwave signals.

* * * * *